US007957539B2

(12) United States Patent
Packard

(10) Patent No.: US 7,957,539 B2
(45) Date of Patent: Jun. 7, 2011

(54) SOUND ENHANCEMENT SYSTEM

(76) Inventor: Thomas N. Packard, Syracuse, NY (US)

( * ) Notice: Subject to any disclaimer, the term of this patent is extended or adjusted under 35 U.S.C. 154(b) by 909 days.

(21) Appl. No.: 11/880,612

(22) Filed: Jul. 24, 2007

(65) Prior Publication Data

US 2007/0269052 A1 Nov. 22, 2007

Related U.S. Application Data

(63) Continuation of application No. 10/336,669, filed on Jan. 6, 2003, now Pat. No. 7,248,702.

(51) Int. Cl.
*H03G 3/00* (2006.01)

(52) U.S. Cl. ............... 381/61; 381/98; 381/108; 84/663

(58) Field of Classification Search .................... 381/61, 381/63, 98, 104–109; 84/662, 663, 702, 84/703, 737, 738
See application file for complete search history.

(56) References Cited

U.S. PATENT DOCUMENTS

| | | | | |
|---|---|---|---|---|
| 6,091,013 | A * | 7/2000 | Waller et al. | 84/663 |
| 6,275,593 | B1 * | 8/2001 | Garcia et al. | 381/98 |
| 6,792,115 | B1 * | 9/2004 | Vierthaler | 381/61 |
| 2003/0002684 | A1 * | 1/2003 | Coats | 381/61 |

* cited by examiner

*Primary Examiner* — Vivian Chin
*Assistant Examiner* — Jason R Kurr

(57) ABSTRACT

A system for enhancing sound quality comprising a filter that square roots the instantaneous amplitude of frequencies in an input signal for generating artificial harmonics corresponding to said frequencies. The system can comprise an automatic level control that momentarily boosts the amplitude of a higher frequency portion of the input signal to emphasize attack transients occurring within the input signal.

20 Claims, 13 Drawing Sheets

400
402
404
406

402'
404'
406'

410
410
408
408

412
400
400
412
412

SOUND ENHANCEMENT SYSTEM

CROSS-REFERENCE TO RELATED APPLICATIONS

This is a continuation of U.S. patent application Ser. No. 10/336,669 filed on Jan. 6, 2003, now U.S. Pat. No. 7,248,702 the content of which is relied upon and incorporated herein by reference in its entirety, and the benefit of priority under 35 U.S.C. §120 is hereby claimed.

FIELD OF THE INVENTION

This invention pertains to the field of sound reproduction devices, and in particular to a sound enhancement device that imparts overtones and transient attack sounds.

BACKGROUND OF THE INVENTION

The recording industry has gone through a number of technologies, successors either affording greater convenience to the user such as longer playing time, and preferably duplicating the live performance more faithfully. Yet even the latest technology has some sort of defect, which the human ear, being a precise instrument, interprets as lack of realism. Defects in the earliest recordings, specifically Edison cylinders and 78 RPM records, comprise foreign particles or scratches in the recording matrix which upon playback produce discrete clicks or pops, and graininess in the recording matrix which is visible under magnification, which upon playback produces high frequency "hiss." With the advent of long play 33⅓ RPM record and magnetic tape, the issue of foreign particles was substantially eliminated, but these media are still susceptible to graininess producing hiss and high frequency distortion during playback. With the advent of the compact disc, the graininess issue was resolved by digital recording techniques but the low sampling rate resulted in limited bandwidth whose sound some have characterized as having sterility or lack of presence. Another type of defect detracting from aural realism involves the compromises in microphone placement utilized in detecting the sound. Microphones that are distant from the origin of the sound are overly sensitive to hall echo. Attack transient components such as produced by the hammer strike of a piano or speech utterance, become blurred. Use of a close microphone alone might improve attack transients, but commensurate use of multi-microphoning to rid the recorded sound of unnatural dryness results in a plurality of mixed phases that likewise have a blurring effect. In either case of microphoning, the sense of space that was present in the live performance is sacrificed, whereby sound transients are muted that otherwise enable the listener of the live performance to spatially locate the origin of the sound. Another cause of blurring is the use of multiple loudspeakers, increasingly common in live music concerts, public theaters, or home theaters. Multiple loudspeakers and the various distances between the loudspeakers and the listener result in a complex array of phases compounded by reflections in the listening hall. The listener is aware of a surround-sound effect but the use of multiple loudspeakers does not improve and may even interfere with spatial location discernment. Another cause of high frequency overtone or attack transient loss is in the wireless transmission of sound where high frequencies and attack transients are deliberately removed from the transmitted signal in order that the transmission does not interfere with another wireless transmission being broadcast at a nearby carrier frequency. Yet another cause of high frequency overtone or attack transient loss is mechanical inertia associated with microphone or loud speaker diaphragms, cutting or reproducing styli, or the like.

The prior art includes devices that alleviate defects in the recording, re-enforcement, or playback of live performances. The applicant is co-patentee of U.S. Pat. Nos. 4,155,041; 4,151,471 and 4,259,742 and is sole patentee of U.S. Pat. No. 4,322,641 and co-pending U.S. patent application Ser. No. 09/286,575. These references disclose three distinctly different and complementary systems for eliminating or reducing defective sound in the playback of old cylinder and disc records. The first of these systems eliminates clicks and pops in the reproduction of monophonic disc or cylinder records by virtue of a switching process that selects reproduction from the momentarily quieter groove wall or from an equal mixture of the two, requiring that the recording be reproduced with two-track, stereophonic equipment. The second of these systems eliminates or greatly reduces the amplitude of clicks and pops that remain after the switching process. The third system reduces the high frequency "hiss" that is not susceptible to reduction by the first and second systems. The second and third systems are applicable to both monophonic and multiple channel recordings. Prior art devices do not compensate for absence of overtones or attack transients, one or both sound characteristics being necessary ingredients for aural realism. These features are missing even in today's highly regarded technology comprising but not limited to compact discs, multiple microphoning, multiple loud speakers, direct video discs (DVD's), and wireless transmission.

SUMMARY OF THE INVENTION

Briefly stated, the present invention is a sound enhancement system that receives a signal representative of the sound denoted "input signal" produced by a microphone, radio transmission, or sound playback device, and modifies the signal which is delivered to a recording device or loudspeaker reproducer. In a preferred embodiment, the sound enhancement system comprises a square root filter that modifies a portion of input signals to generate artificial overtones that either re-enforce or replace overtones in the input signal. In another aspect of the invention, the artificially generated overtones may be momentarily boosted in amplitude to emphasize attack transients detected by the system in the input signal. In another aspect of the invention, the amount of artificial overtone signal and the amount of attack emphasis are user adjustable. The input signal thus processed is provided to an output terminal of the system which output signal is utilized to drive recording devices or loudspeakers. The invention, in one or more of its disclosed embodiments, provides:

a system for processing an information bearing signal, the system comprising an input device configured to receive the information bearing signal from a signal source, a first control circuit coupled to the input port, the first control circuit being configured to generate a normalized information bearing signal in accordance with a predetermined first transfer function, the normalized information bearing signal being a function of a predetermined signal reference, a transient detection circuit coupled to the first control circuit and the predetermined signal reference, the transient detection circuit being configured to detect transient signal components in the normalized information bearing signal and generate a detection response signal, the detection response signal being a function of the predetermined signal reference and transient impulse signals corresponding to detected transient signal components, a second control circuit coupled to the first control circuit and the transient detection circuit, the second control circuit being configured to combine the normalized information bearing signal with the detection response signal in accordance with a second predetermined transfer function to thereby generate a conditioned signal, the conditioned signal including the information bearing signal with gain enhanced transient signal components, and an output device coupled to the second control circuit, the output device being configured to propagate the conditioned signal in accordance with a predetermined signal format. a system for processing an information bearing signal, the system comprising an input device configured to receive the information bearing signal from a signal source, a first control circuit coupled to the input port, the first control circuit being configured to generate an amplitude information bearing signal in accordance with a predetermined first transfer function, a transient detection circuit coupled to the first control circuit and the predetermined signal reference, the transient detection circuit being configured to detect transient signal components in the amplitude bearing signal and generate a detection response signal, the detection response signal being a function of the transient impulse signals corresponding to detected transient signal components, a second control circuit coupled to the first control circuit and the transient detection circuit, the second control circuit being configured to combine the information bearing signal with the detection response signal in accordance with a second predetermined transfer function to thereby generate a conditioned signal, the conditioned signal being the information bearing signal with gain enhanced transient signal components, and an output device coupled to the second control circuit, the output device being configured to propagate the conditioned signal in accordance with a with a predetermined signal format.

DETAILED DESCRIPTION OF THE PREFERRED EMBODIMENTS

Figure 1:
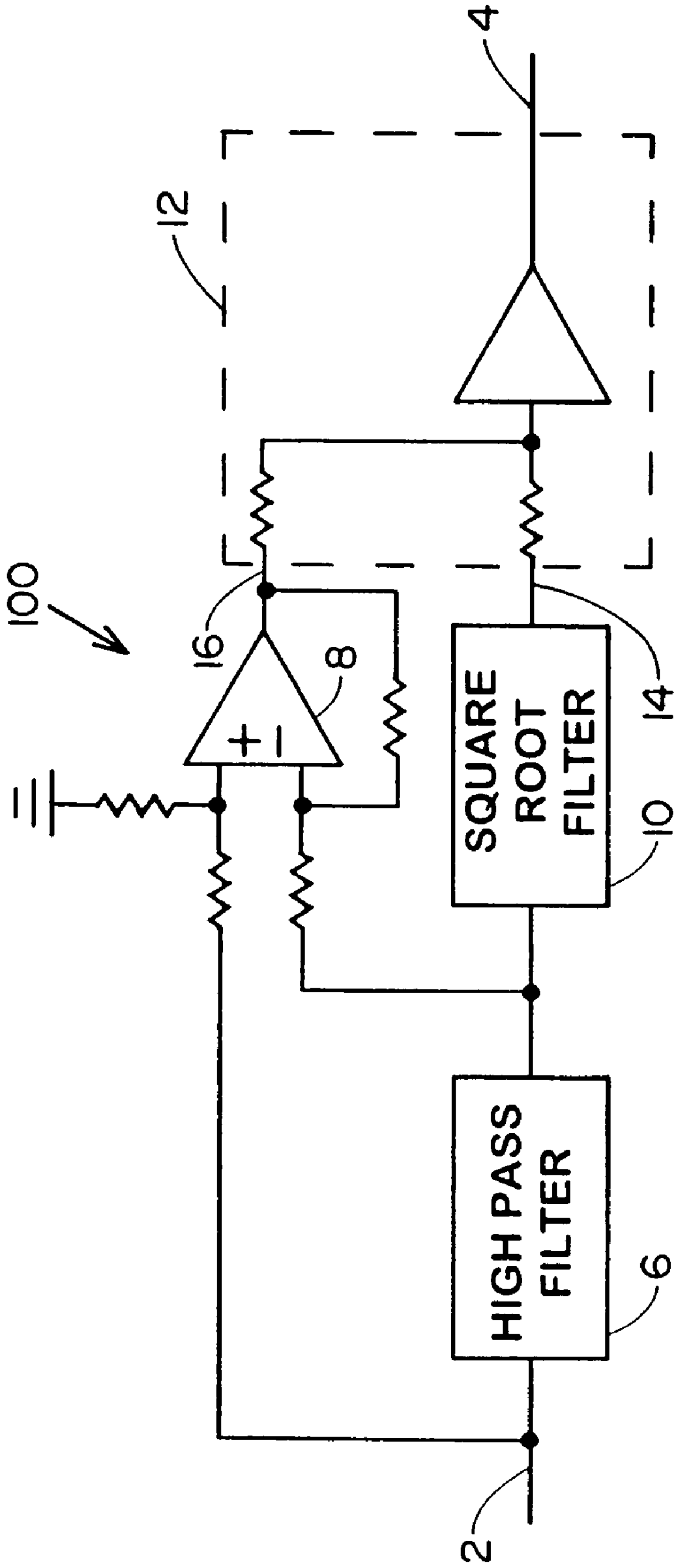
FIG. 1 is a basic schematic block diagram representation of the sound enhancement system that includes a square root filter for artificial overtone generation.

Referring to FIG. 1, an input terminal 2 of the sound enhancement system 100 receives electrical signal, or "input signal" from a microphone or recorded medium. Input terminal 2 is connected to a high pass filter 6 which in turn is connected to a square root filter 10 that provides signal to a first input 14 of summer 12. Complementary filter 8 receives signal from input terminal 2 and may receive subtractive signal from high pass filter 6 as shown. The complementary filter 8 passes input signals that are not passed by high pass filter 6, that is, complementary filter 8 is essentially a low pass filter. The output of complementary filter 8 comprises the signal at the second input 16 of summer 12. The output of summer 12 is connected to the output terminal 4 of sound enhancement system 100. The instantaneous signal from square root filter 10 varies as the square root of the instantaneous signal from high pass filter 6. For a high pass filter 6 output signal represented by the equation Vin(x)=Vp sin x, for example, the output signal from square root filter 10 can be represented by the equation Vout(x)=Vk $\sin^n$ x, where Vp and Vk are peak voltages, and n=½. To demonstrate that overtones, also known as harmonics, are generated by square root filter 10, a Fourier series analysis can be applied to the generalized equation Vout(x)=Vk $\sin^n$ x for which exponent "n" is any positive value including fractional values such as one half. Vout(x) can be written as an equivalent Fourier series Vout(x)=V0+Val sin 1x+Vb1 cos 1x+Va2 sin 2x+Vb2 cos 2x+Va3 sin 3x+Vb3 cos 3x . . . +Vak sin kx+Vbk cos kx, wherein V0, Val through Vak, and Vb1 through Vbk are mathematically derivable constants by those skilled in the art whose values depend on the value of exponent "n." The "V0" term is a DC voltage component. The "Va1 sin 1x" and "Vbl cos 1x" terms are at the frequency of Vin(x), known as the fundamental frequency. The remaining terms represent an infinite series of overtones not present in Vin(x). Ordinarily the signal at input terminal 2 is comprised of a plurality of fundamental frequencies. As is the case with all high pass filters, high pass filter 6 blocks low frequency components comprising fundamental components and their low frequency overtones presumed to be faithfully reproduced, and passes the higher fundamental frequencies for square root filter 10 to detect, whose comparatively higher frequency overtones are not faithfully reproduced and in need of replacement or reenforcement through square rooting. Complementary filter 8 couples the low frequency fundamentals and overtones from the signal at input terminal 2 to input 16 of summer 12. Square root filter 10 couples high frequency fundamentals and overtones generated therefrom to input terminal 14 of summer 12. Since filter 8 is the complement of high pass filter 6, the signal at output terminal 4 of sound enhancement system 100 is the same as signal at input terminal 2 except for the artificial overtones from square root filter 10 ostensibly for input frequencies above the corner frequency of high pass filter 6, or about 1 kHz.

Figure 2:
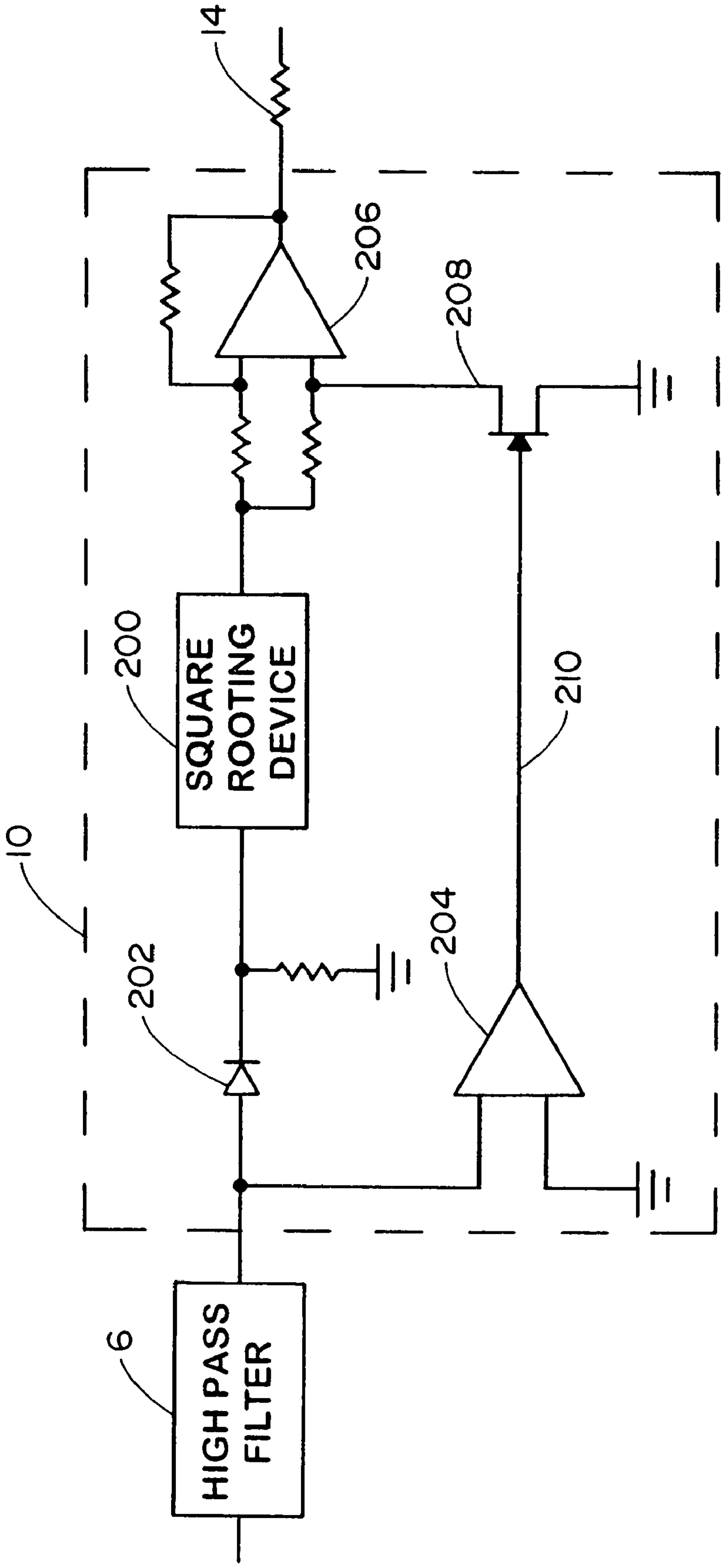
FIG. 2 is a schematic block diagram representation of the square root filter block.

Referring to FIG. 2, the details of square root filter 10 demonstrate how positive and negative input voltages from the AC signal at input terminal 2 and high pass filter 6 can be square rooted. References that serve the same function as FIG. 1 are given the same designations. Square rooting device 200 comprises any of a number of integrated circuits known in the industry, such as manufactured by Analog Devices. High pass filter 6 provides signal to full wave rectifier 202 which provides signal to the square rooting device 200, such that all voltages to be square rooted are positive. High pass filter 6 also provides signal to a comparator 204. Output terminal 210 of comparator 204 provides signal to FET 208. Square rooting device 200 provides signal to selective inverter 206 which provides signal to summer input 14. During positive signals from high pass filter 6, comparator 204 output 210 is LOW, FET 208 is OFF, and selective inverter 206 is in a non-inverting state such that the positive square rooted signal from square rooting device 200 is provided to input 14 of summer 12. During negative signals from high pass filter 6, comparator 204 output 210 is HIGH, FET 208 is ON, and selective inverter 206 is in an inverting state such that the positive square rooted signal from square rooting device 200 is inverted and negative signal is provided to input 14 of summer 12. Positive and negative input voltages from filter 6 are square-rooted thereby.

Figure 3:
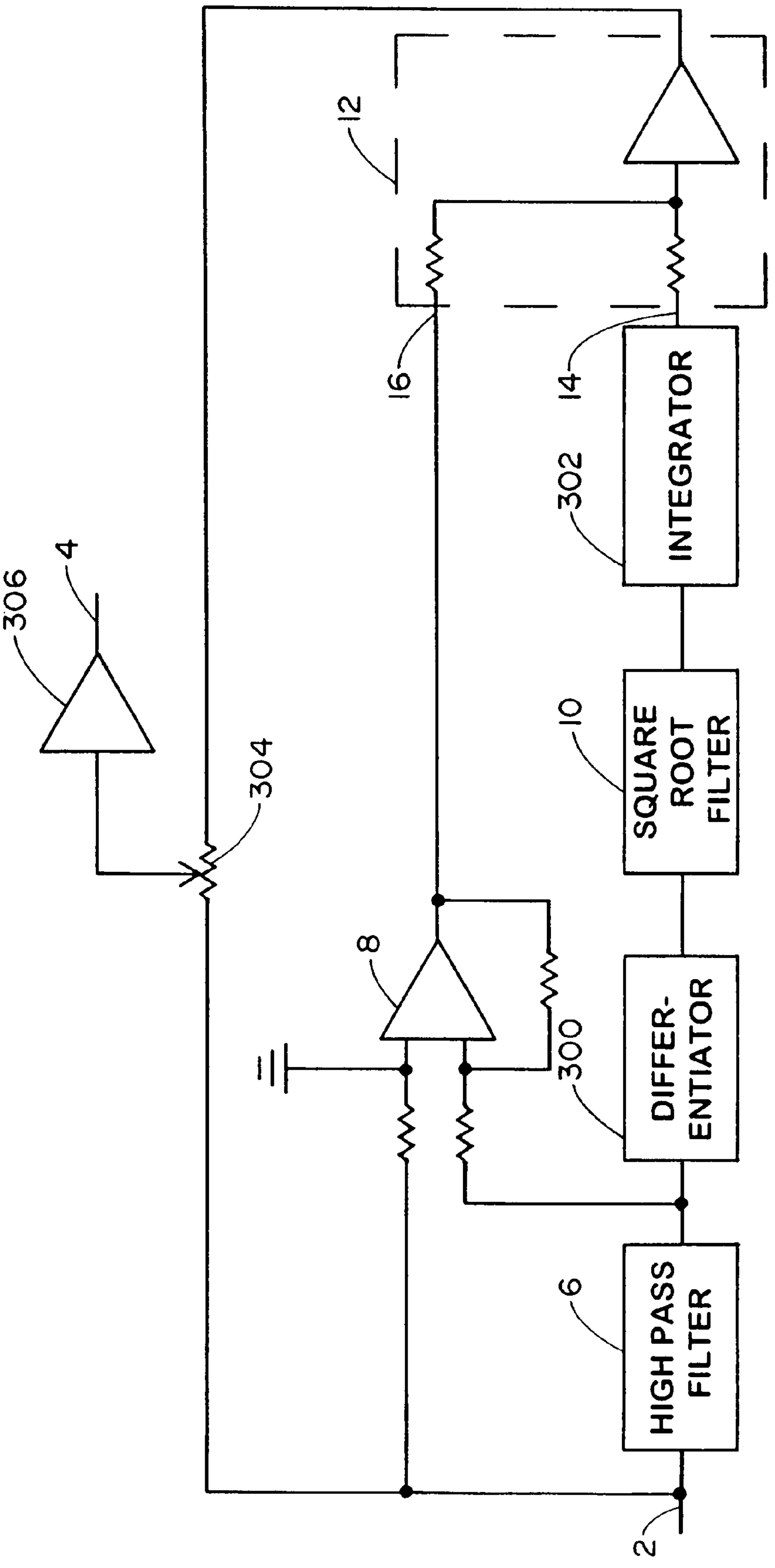
FIG. 3 is a schematic block diagram representation in which additional filters and brightness control features have been added to the basic block diagram.

Referring to FIG. 3, a schematic block diagram is shown that is similar to FIG. 1. A differentiator 300 has been inserted between high pass filter 6 and square root filter 10 and integrator 302 has been inserted between square root filter 10 and input 14 of summer 12. The purpose of differentiator 300 is to accentuate high frequencies within the signal from high pass filter 6 such that the transitions from comparator 204 of FIG. 2 are dependent on the zero-crossings of the higher frequencies within a plurality of simultaneous frequencies received at input terminal 2. The purpose of integrator 302 is to provide a high frequency attenuation that negates the high frequency boost from differentiator 300. In this manner, the square root filter 10 is responsive to the higher frequencies from high pass filter 6 which are those most in need of artificial overtone production.

In another aspect of the invention, brightness control potentiometer 304 has been added, receiving signal from input terminal 2 at one end of adjustment and summer 12 at the other end of adjustment, to provide signal to output buffer 306 which in turn provides signal to output terminal 4 of sound enhancement system 100. At the terminal 2 end of rotation, the output terminal 4 signal is the same as the input terminal 2 signal. At the other end of rotation, the output terminal 4 signal is the input terminal 2 signal plus overtones within a frequency range established by high pass filter 6 and differentiator 300. Potentiometer 304 allows the user to adjust the amount of overtones at output terminal 4. It is important that the signals at the extremities of rotation be of approximately the same phase in order that fundamental frequencies or artificial overtones from summer 12 do not inadvertently cancel frequencies that may be present in input signal 2. Since the phase shifts of differentiator 300 and integrator 302 are equal and opposite, taken together they produce no net phase shift from summer 12. Likewise the square root of a function and the function itself have the same zero crossings, so square root filter 10 does not produce a phase shift from summer 12. The artificial overtones and input frequencies from summer 12 are in phase with the input frequencies at input terminal 2.

Referring to FIG. 4, a set of electrical waveforms are shown that pertain to various locations in the schematic diagrams in FIGS. 1-3. FIG. 4A is a sine wave 400 which represents a single frequency at the output of differentiator 300 passing through zero at points 402,404 and 406. FIG. 4B is the waveform at output 210 of comparator 204 showing corresponding transitional states at 402', 404' and 406'. FIG. 4C waveform 408 is the corresponding signal from full wave rectifier 202, and waveform 410 is the corresponding signal from the square rooting device 200. FIG. 4D is the corresponding signal 412 from selective inverter 206, waveform 400 repeated to demonstrate how the wave shape has been altered. The square rooting operation exaggerates the slopes without increase in amplitude of signals from differentiator 300, distorting the shape of the waveform and creating overtones thereby. Experimentation has indicated that the plurality of inertial effects from microphone or loudspeaker diaphragms or cutting styli, or the slow digitized sampling rate associated with digitally recorded media have an opposite effect to square rooting by reducing slope steepness without necessarily altering signal amplitude. Thus square rooting compensates for inertial and digitized sampling rate effects to recreate the waveshape associated with the live sound, that is, the created overtone from square rooting add realism to the sound.

Figures 4A, 4B, 4C, 4D:
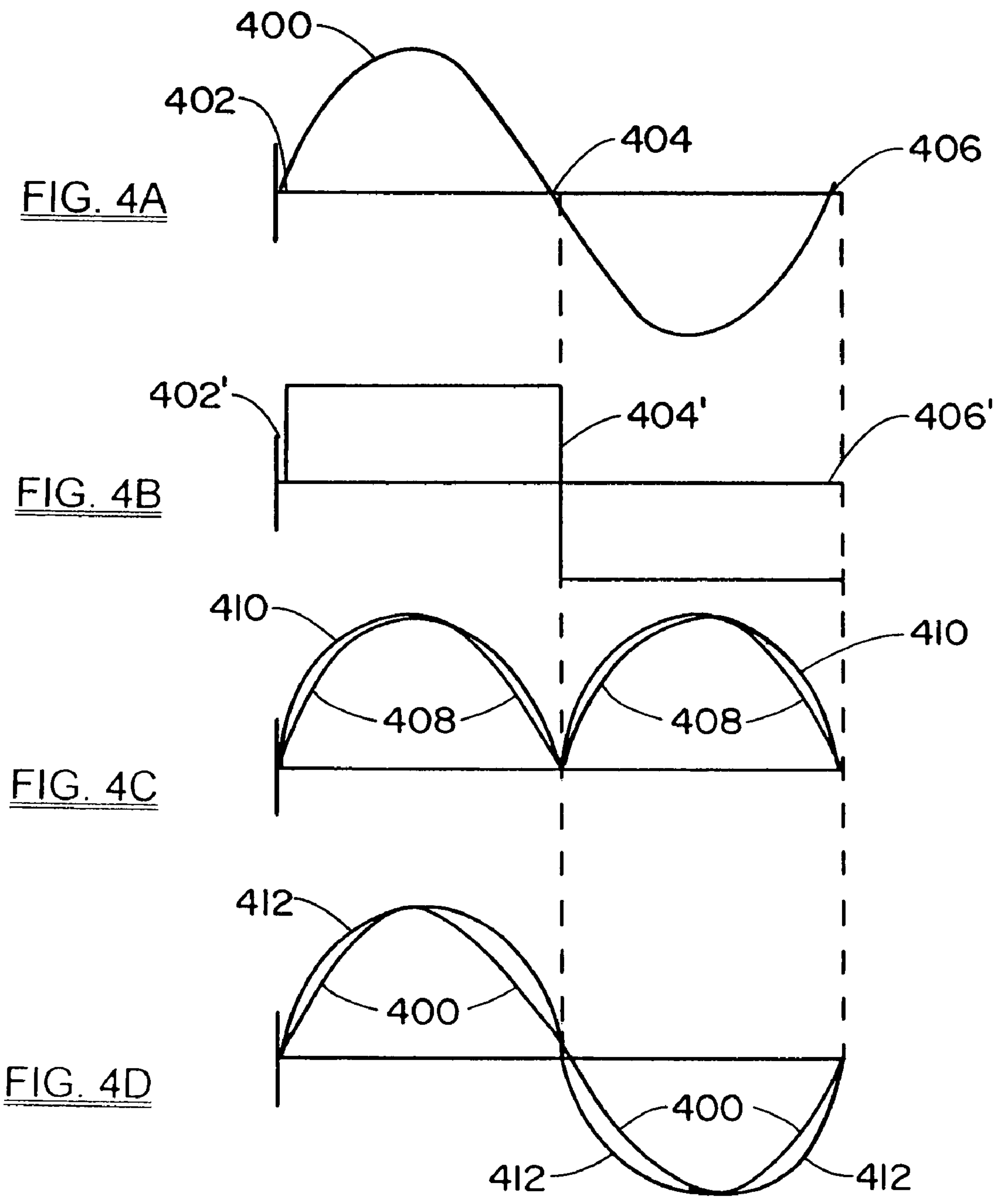
FIGS. 4A-4H and 4J represent electrical waveforms associated with FIGS. 1 through 3.
Figure 4E:
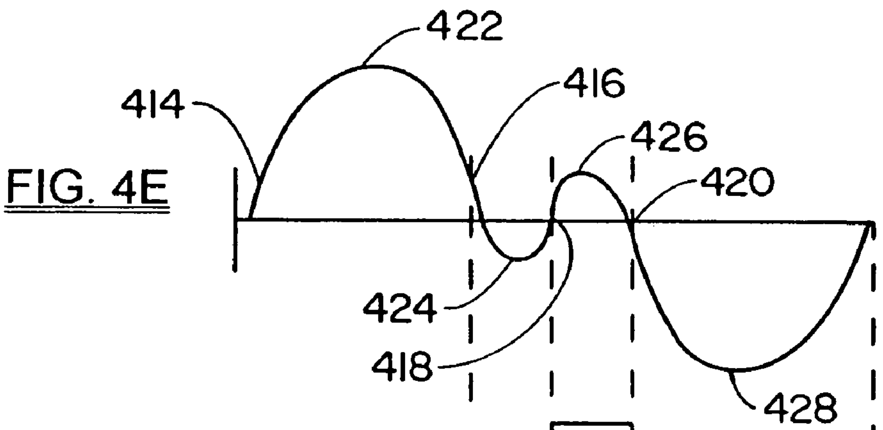
Figure 4F:
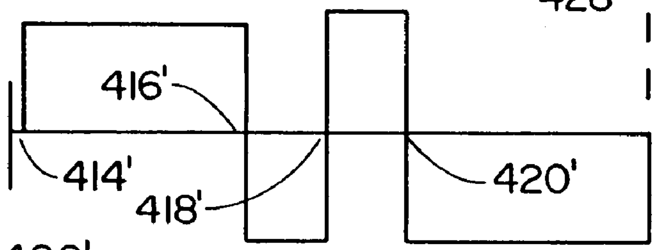
Figure 4G:
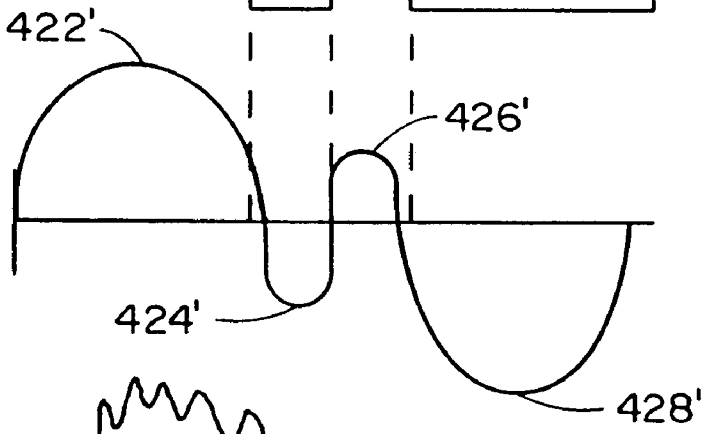

FIG. 4E demonstrates another situation in which the signal from high pass filter 6 comprises two simultaneous frequencies, the combination of which passes through zero at points 414,416,418 and 420. Maxima are shown at points 422 and 428 that have greater amplitudes than the maxima shown at points 424 and 426. FIG. 4F is the waveform at the output 210 of comparator 204 if differentiator 300 is omitted as in FIG. 1 wherein high pass filter 6 provides signal directly to square root filter 10. Zero cross points 414,416,418, and 420 in FIG. 4E produce state transitions 414', 416',418' and 420' in FIG. 4F. FIG. 4G is the waveform at the output of the square root filter 10. As the square rooting function is applied to the waveform of FIG. 4E, maxima 424' and 426' are greater in amplitude with respect to maxima 422' and 428' than predicted from proportional comparison to maxima 422,424,426 and 428. Undue emphasis of lower level maxima, such as maxima 424' and 426' by square root filter 10 may cause an unnatural ordering of frequencies or spurious overtones at output terminal 4. This issue is alleviated by differentiator 300 and the schematic diagram of FIG. 3. If the waveform of FIG. 4E is presented to differentiator 300, differentiator 300 separates through greater amplification the higher of the two frequencies such that the output of differentiator 300 resembles the sine wave waveform of FIG. 4A, which in turn is processed satisfactorily as shown in FIGS. 4B-4D. The higher frequencies in signal at input terminal 2 are those most in need of artificial overtone creation.

Figure 4H:
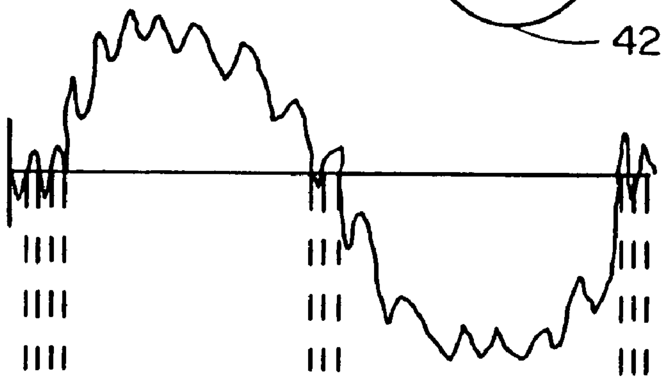
Figure 4J:
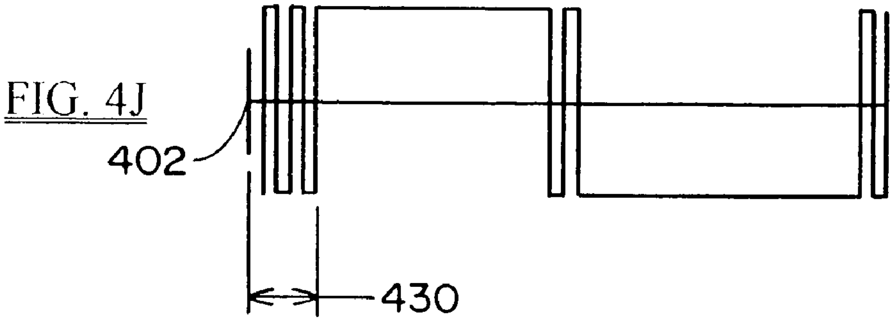

FIG. 4H represents another situation in which the output signal of high pass filter 6 as shown in FIG. 4A has an added component of high frequency noise or "hiss", which, as previously described is a common defect in early sound recordings. High frequency noise is emphasized to an even greater extent by differentiator 300. FIG. 4J is the output waveform of comparator 204 which shows a plurality of zero cross transitions in zone 430 near the zero cross transition of the signal component at point 402. The plurality of transitions may cause a masking effect of the artificial overtones or undue high bandwidth requirement placed on square rooting device 200 in order to faithfully follow the rapid plurality of zero cross transitions. Since the "hiss" amplitude tends to be much less than the amplitude of the signal amplitude, the amount of hiss from square root filter 10 tends to be exaggerated in the same manner as previously described maxima 424' and 426'. Said differently, the sound enhancement system 100 can cause an undesirable reduction of signal to noise ratio for low levels of high frequency noise. This problem is alleviated by converting high pass filter 6 into a band pass filter, the upper corner frequency of the filter being approximately 8 kHz. In this manner, the high frequency noise component of the input signal at input terminal 2 is outputted by complementary filter 8 to input 16 of summer 12, rather than by filter 6, to square root filter 10 and to input 14 of summer 12, whereby there is no high frequency noise emphasis. Likewise, a pole at approximately 8 kHz may be incorporated in differentiator 300 to transform differentiator 300 into a high pass filter. Either or both strategies limit the magnitude of high frequency noise to below a residual threshold which the square root filter 10 ceases to detect. Either or both strategy may also benefit modem sound recordings and playback thereof. Overtones may be usefully generated from lower input frequencies. Sibilance sounds which reside in higher input frequencies would not be unduly emphasized.

Figure 5A:
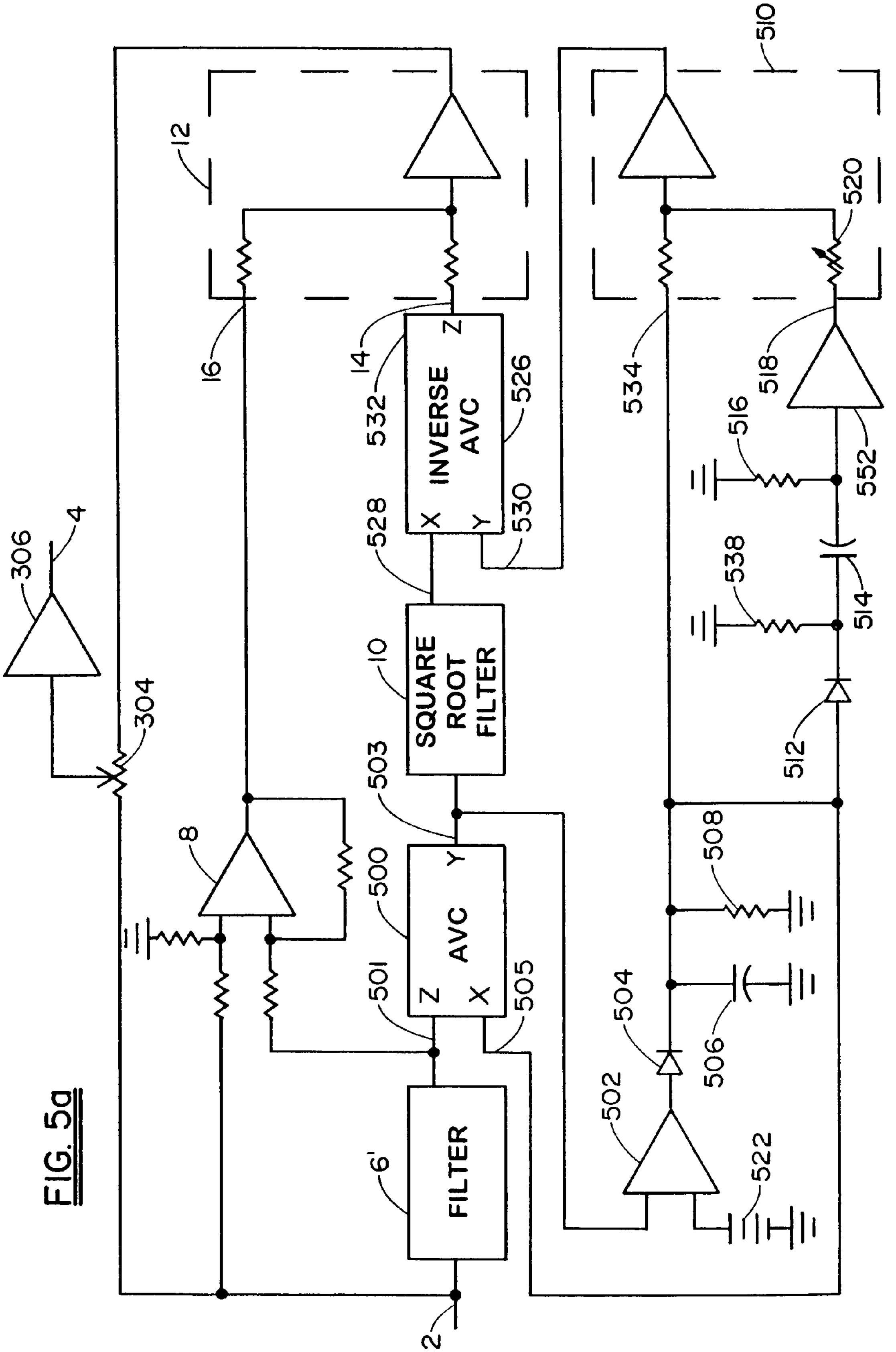
FIG. 5A is a schematic block diagram representation in which automatic volume control and attack transient control features have been added to the basic block diagram.

Referring to FIG. 5A, a schematic block diagram is shown that is similar to FIG. 1. An automatic volume control or "AVC" 500 is inserted between the output of high pass filter 6 which may alternatively be a band pass filter as previously described, all forms of which are to be denoted filter 6', and input of square root filter 10. AVC 500 can be a four quadrant multiplier device having the transfer function xy=z, whereby filter 6' provides signal to z terminal 501 of AVC 500 and y terminal 503 of AVC 500 provides signal to the square root filter 10. The y terminal 503 of AVC 500 also provides signal to comparator 502 whose other input is connected to DC reference 522. The output of comparator 502 is connected to a rectifier 504 which charges capacitor 506 to a DC voltage. Resistor 508 in parallel with capacitor 506 is a bleeder. Capacitor 506 is also connected to the x input 505 of AVC 500, completing a negative feedback loop that encompasses AVC 500 and comparator 502. The negative feedback action causes capacitor 506 to maintain particular DC voltages such that the peak voltage at y terminal 503 of AVC 500 is the same as DC reference voltage 522 irrespective of the voltage at the output of filter 6'. Since the amplitude provided to square root filter 10 is a constant, square root filter 10 does not unduly emphasize overtones produced by low levels of input signals.

As an additional and independent feature, FIG. 5A contains an inverse AVC 526 which can be a four quadrant multiplier inserted between square root filter 10 and input 14 of summer 12. In particular, the output of square root filter 10 provides signal to x terminal 528 of inverse AVC 526, and z terminal 532 of inverse AVC 526 provides signal to input 14 of summer 12. The DC voltage on capacitor 506 is provided to input 534 of summer 510 which provides signal to y input 530 of inverse AVC 526. The voltage on capacitor 506 is a dividing influence on the output voltage of AVC 500 and an equal multiplying influence on the output voltage of inverse AVC 526, such that the amplitude of the voltage at the output of inverse AVC 526 tracks proportionally the amplitude at the output of filter 6' irrespective of the square rooting operation performed by square root filter 10. Since AVC 500 and inverse AVC 526 strictly modify the gain, whether taken together or individually, the objective of avoiding phase shift between the filter 6' output and input 14 of summer 12 is maintained.

Another independent feature shown in FIG. 5A is a transient attack emphasizing capability. Capacitor 506 provides signal through a series network comprising half wave or full wave rectifier 512, capacitor 514 and resistor 516 the free end of which is connected to ground. Resistor 538 also receives a signal from rectifier 512 and is connected to ground to serve as a bleeder. When an attack transient occurs in the signal from filter 6', capacitor 506 experiences an abrupt step increase in voltage so as to maintain a constant voltage at output 503 of AVC 500 as previously described. Capacitor 514, whose corresponding increase in voltage is retarded by the RC time constant comprising the values of capacitor 514 and resistor 516 does not charge appreciably, wherein the step increase voltage at capacitor 506 appears on resistor 516. For slowly varying voltages from filter 6', comprising those signal portions that are devoid of attack transients, the voltage change on capacitor 506 is correspondingly slow. Capacitor 514 has sufficient time to charge wherein there is little or no voltage drop across resistor 516. Thus an appreciable voltage appears across resistor 516 only when there are attack transients in the signal from filter 6'. The duration of the appreciable voltage is established by the time constant set by the values of resistor 516 and capacitor 514 to be approximately 50 milliseconds. Bleeder resistor 538 discharges capacitor 514, enabling the series circuit to be responsive to the next attack transient from filter 6'. Resistor 516 provides signal to buffer 552 to the input 518 of summer 510. Since y input 530 of inverse AVC 526 is responsive to the signal provided by summer 510, and summer 510 is responsive to the voltages at both of its input terminals 534 and 518, the gain of inverse AVC 526 is momentarily boosted during the time constant interval by the momentary voltage appearing at input 518. Input 518 of summer 510 may also comprise a user adjustable potentiometer 520 for controlling the amount of gain increase in AVC 526 for the given attack transient amplitude received from the output of filter 6'.

Figure 5B:
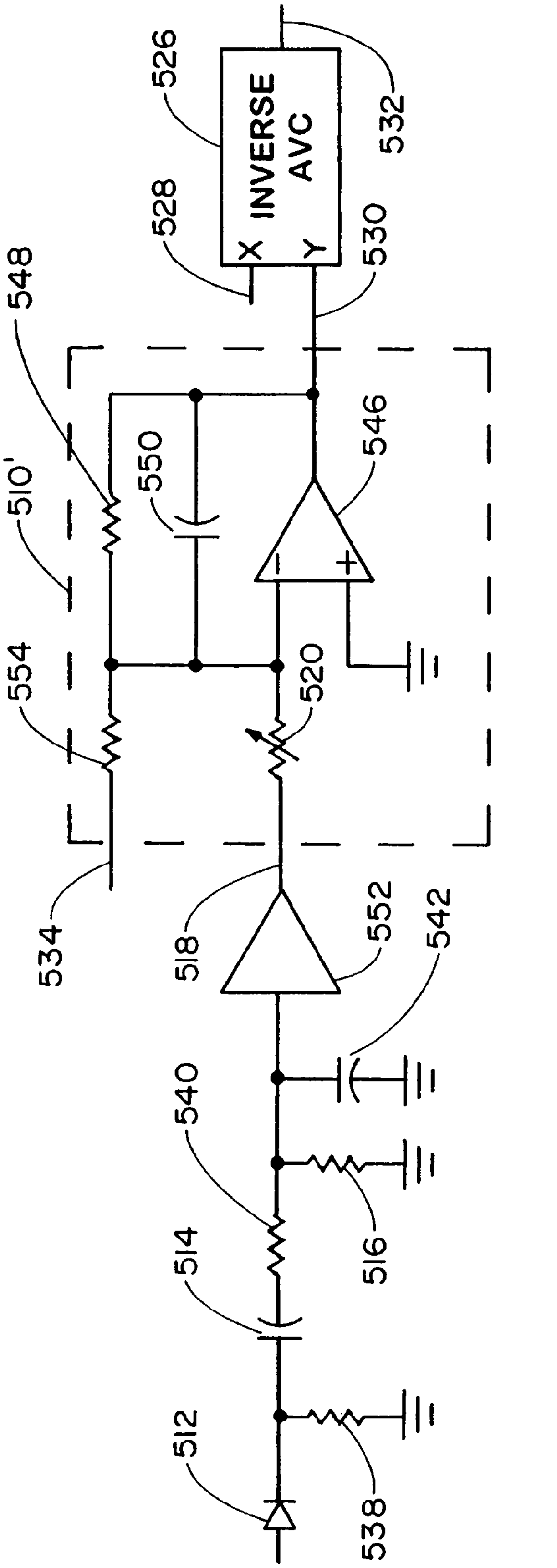
FIG. 5B is a modified block diagram portion of FIG. 5A.

Referring to FIG. 5B, which is a modification of a portion of the schematic block diagram of FIG. 5A, an additional resistor 540 and capacitor 542 have been added whose function is to prevent an appreciable voltage rise across resistor 516 for attack transients having durations less than about 2 milliseconds. In this manner, the attack transient feature is still responsive to musical transients with little or no ill effect, but the brief attack transients associated with the record wear, clicks or pops of early sound recordings are ignored. As a complementary feature to address record wear of a longer duration, summer 510 can be modified into a delaying summer 510' comprising resistor 554 and potentiometer 520 providing signal to the non-inverting input of operational amplifier 546 from inputs 534 and 518 respectively. The output of operational amplifier 546 provides signal to y input 530 of AVC 526. Operational amplifier 546 has negative feedback components comprising resistor 548 and delaying capacitor 550. In response to the onset of a period of record wear the voltage on capacitor 506 rises as previously described to cause a gain decrease in AVC 500 such that the y terminal voltage of AVC 500 is a constant. The delay in voltage increase at the output of operational amplifier 546 due to delaying capacitor 550 prevents the gain of inverse AVC 526 from rapidly rising to the steady state value, reducing system gain during record wear of a longer duration. Delaying summer 510' and the attack transient circuit components comprising capacitor 514 and resistor 516 can be chosen such that sound enhancement system 100 is able to emphasize attack transients while de-emphasizing prolonged record wear.

Figure 6:
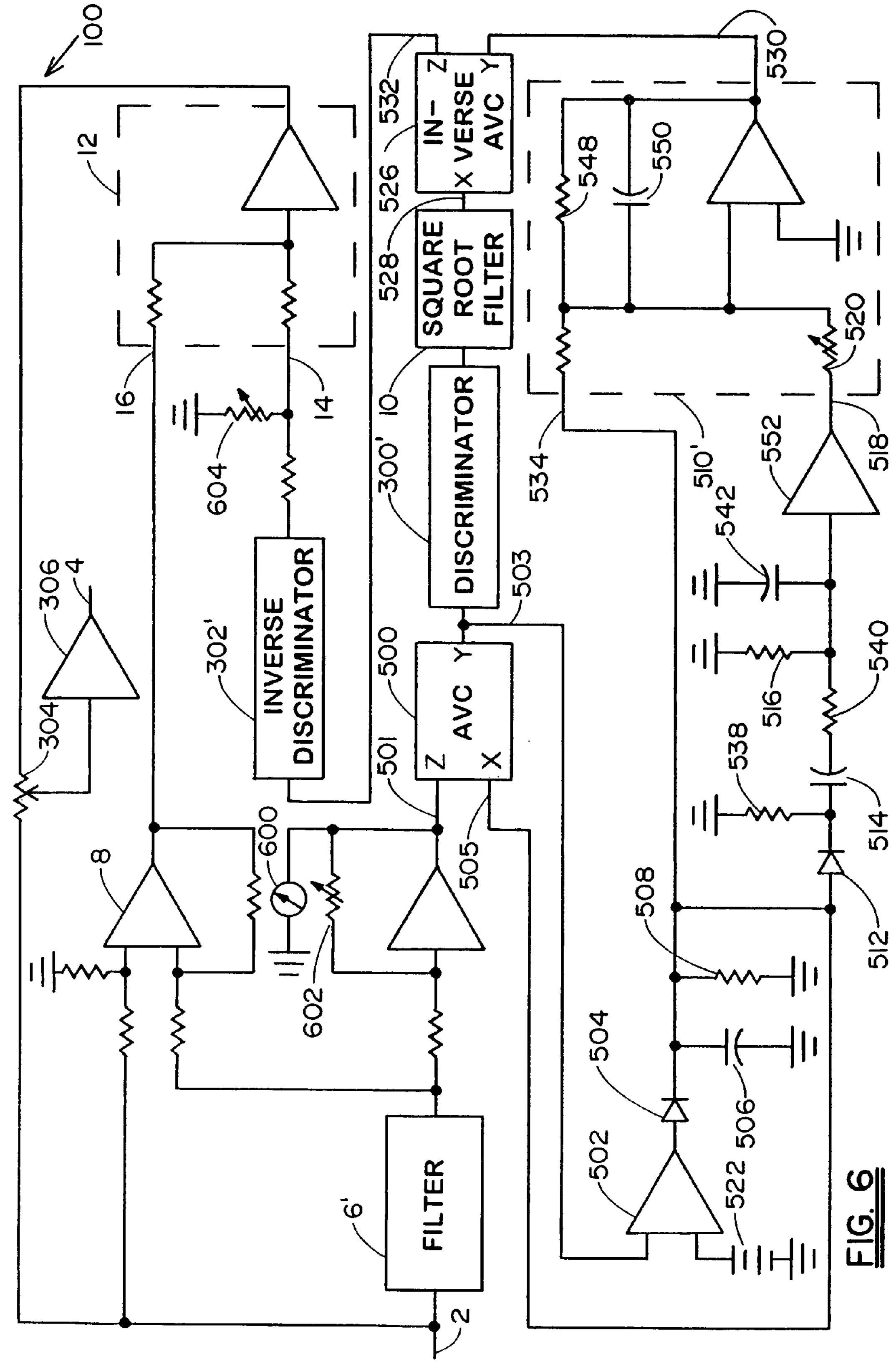
FIG. 6 is a schematic block diagram representation in which additional filter, brightness control, automatic volume control and attack transient control features have been integrated into the basic block diagram.

FIG. 6 is a schematic block diagram that unites features of FIG. 1, FIG. 3 and FIGS. 5A and B with the individual advantages as previously described. Differentiator 300 and AVC 500 are inserted between filter 6' and square root filter 10 wherein differentiator 300 may be a high pass filter as previously described, all forms to be denoted discriminator 300'. In the preferred embodiment, y terminal 503 of AVC 500 provides signal to discriminator 300' and the output of discriminator 300' provides signal to square root filter 10 and comparator 502, such that discriminator 300' is inside the negative feedback loop comprising AVC 500 and comparator 502 as previously described Discriminator 300' provides a constant voltage amplitude to square root filter 10 regardless of whether there is low voltage input signal or the frequency of the input signal resides outside of the range of frequencies passed by: filter 6' or discriminator 300'. The resulting gain boost enables square root filter 10 to faithfully process even low frequency input signals whose overtones may also be of low frequency and not in need of re-enforcement or replacement. The high gain required of AVC 500 is achieved by a low voltage on capacitor 506 provided to x terminal 505 of AVC 500.

Integrator 302 of FIG. 3 and inverse AVC 526 of FIG. 5A are inserted between square root filter 10 and input 14 of summer 12; integrator 302 may be a low pass filter as previously described, all forms to be denoted in FIG. 6 as inverse discriminator 302'. Low voltages on capacitor 506 due to low voltage input signals result in inverse AVC 526 having a low gain to compensate for the boosted signal provided to square root filter 10. Thus low frequency components of the input signal are faithfully processed by square root filter 10 to produce overtones and are thereafter attenuated by inverse AVC 526 to about the same level as the input signal level.

Should discriminator 300' and inverse discriminator 302' comprise high pass and low pass filters, the corner frequencies of the two filters may slightly mismatch without appreciable effect on the zero phase shift objective for signals between filter 6' and input 14 of summer 12 in order to provide a slight emphasis or de-emphasis of high frequency overtones, whichever strategy creates the better sound enhancement.

In order to achieve the greatest range of automatic volume control from AVC 500, a VU meter 600 is connected to the output of filter 6'. Gain control 602 and inverse gain control 604 allow the user to adjust the reading on VU meter 600 without disturbing the overall system gain between input terminal 2 and output terminal 4. The gain and inverse gains may be controlled in tandem using a single, dual section potentiometer (not shown.)

Figure 7A:
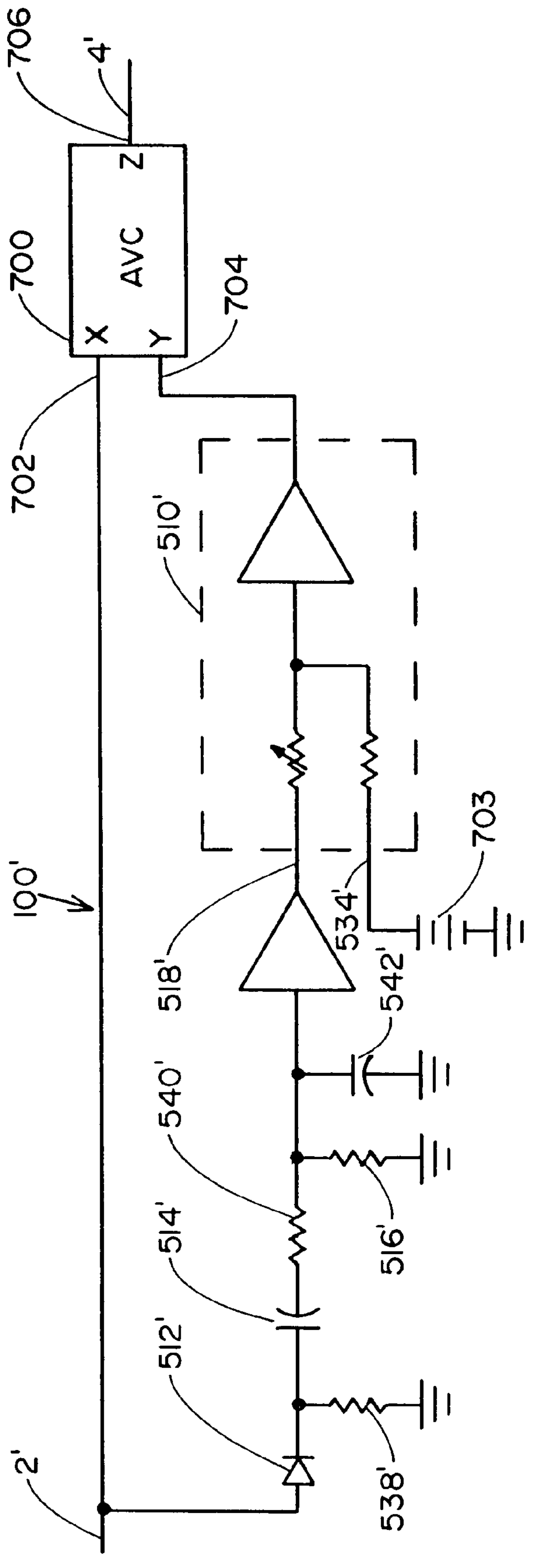
FIGS. 7A-7D are alternate basic block diagram representations of the sound enhancement system that includes attack transient emphasis.

Referring to FIG. 7A, an alternate basic schematic block diagram is shown which applies to recorded material, public address systems, or the like, wherein the overtones have realism but attack transients may be blurred through the use of improperly placed microphones, or the use of multiple loudspeakers that result in multi-path phase distortion. Blurring may be caused by the mechanical inertia in microphone or loudspeaker diaphragms. Blurring may also be caused by lack of stereophonic imagery in multiple channel input signals that have ample overtones but that are too similar, or by a solo instrument or vocalist that is hidden within a plurality of sounds from the live performance. For each origin of blurring, the use of attack transient emphasis can lift particular instruments or soloists out of a fabric of sound or may serve to recreate the attack transients that were present in the live performance but absent in the reproduction process intended to be a facsimile.

Input terminal 2' of sound enhancement device 100' provides input signal to x terminal 702 of AVC 700. Input terminal 2' also provides signal to rectifier 512', resistor 538', capacitor 514', resistor 540', resistor 516', and capacitor 542', whose functions are the same as the unprimed like designations previously described, comprising an attack transient detector for detecting transients as they occur in the input signal. The voltage drop across resistor 516' is the output of the attack transient detector which provides signal to input 518' of summer 510'. Input 534' of summer 510' is connected to a DC reference voltage 703. The output of summer 510' provides signal to the y terminal 704 of AVC 700. When input signal is devoid of attack transients, the gain of AVC 700 is constant set by the level of voltage from DC voltage reference 703. When an attack transient occurs, there is a voltage at input 518' of summer 510' producing an incremental voltage on y terminal 704 of AVC 700 whose z terminal 706 accordingly provides momentarily boosted gain. AVC 700 emphasizes attack transients thereby in the same manner as previously described for inverse AVC 526.

Figure 7B:
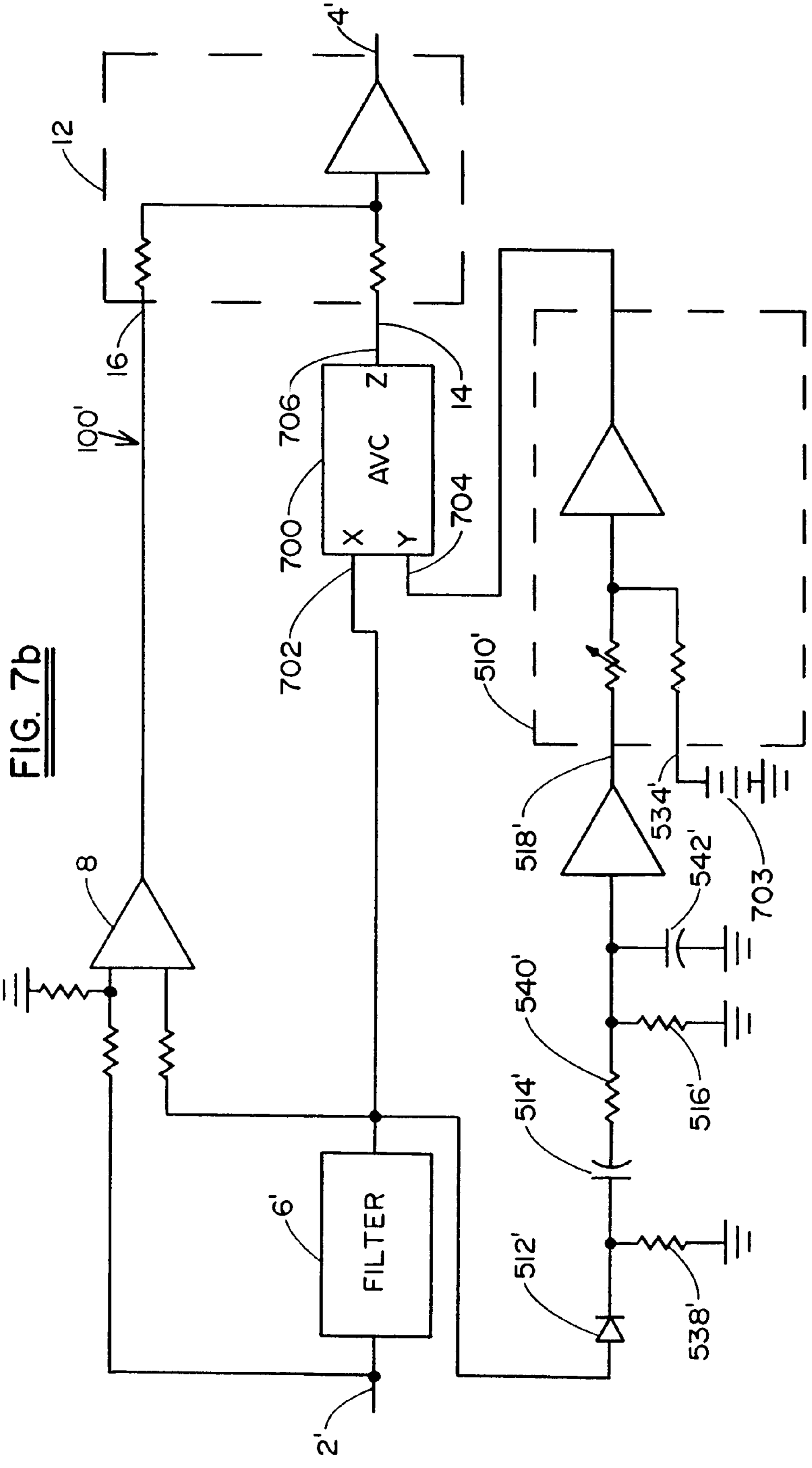

FIG. 7B is the same as the schematic shown in FIG. 7 A but with added filters. Filter 6' is inserted between input terminal 2' and x terminal 702 of AVC 700. Summer 12 is inserted between AVC 700 and output terminal 4', in which the input terminal 14 of summer 12 is connected to z terminal 706 of AVC 700. Complementary filter 8 is connected between input terminal 2' and input terminal 16 of summer 12. It may be preferable to subdivide the input signal at input terminal 2' by using filter 6', inverse filter 8, and summer 12 as previously described, whereby the attack transients to be emphasized are above a particular frequency. "Boominess" that could be caused by emphasis of the low frequency components of the attack transient is avoided. Furthermore, AVC 700 boosts just the high frequency components of the attack transient which are those that the human ear relies upon to locate a sound. However, the schematic shown in FIG. 7A could be preferable compared to the schematic shown in FIG. 7B if the low frequency components of the input signal are weak and in need of re-enforcement.

Figure 7C:
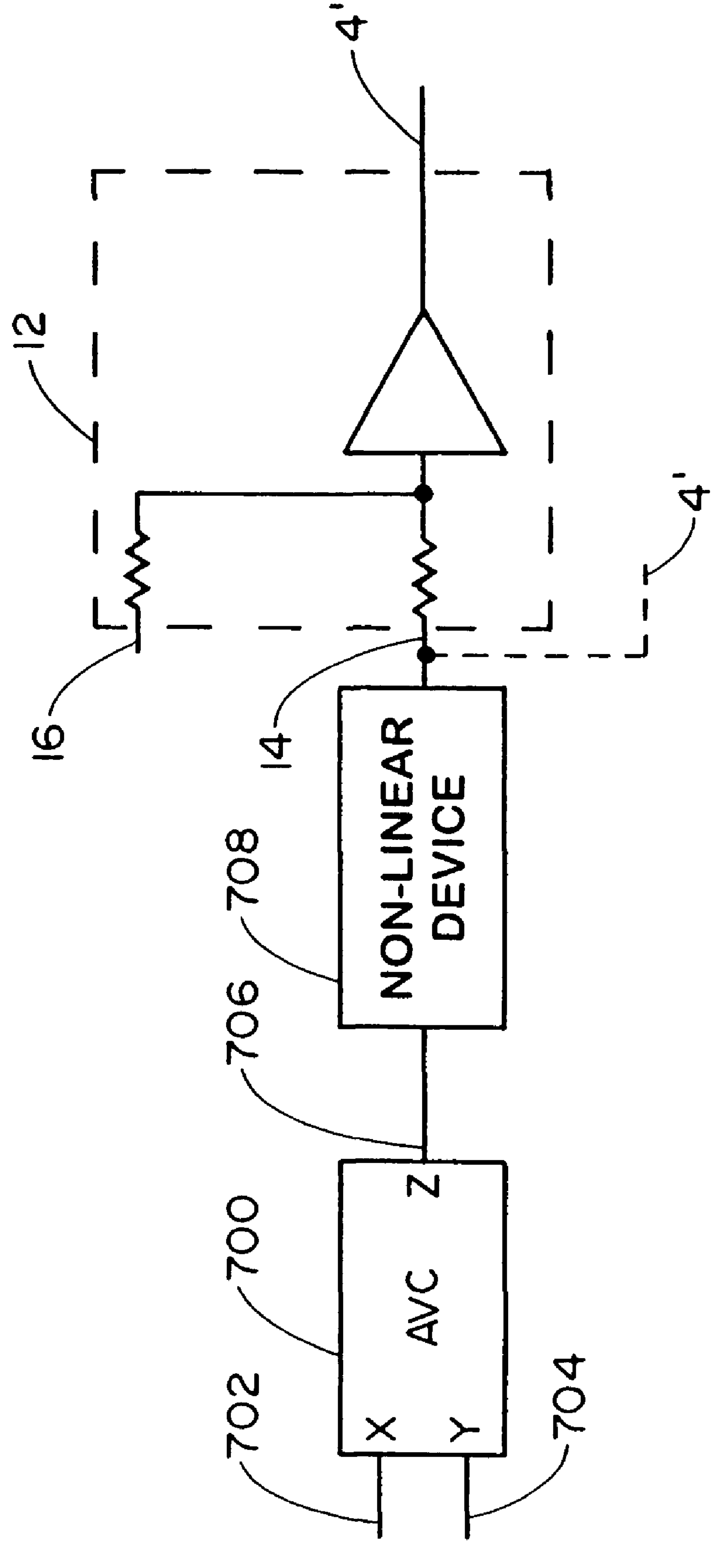

FIG. 7C includes a non-linear device 708 inserted between z terminal 706 of AVC 700 and output terminal 4' if applied to FIG. 7 A, or between z terminal 706 of AVC 700 and input terminal 14 of summer 12 if applied to FIG. 7B. Furthermore, non-linear device 708 can replace square root filter 10 in FIG. 3, 5 or 6, other components serving like function. Non-linear device 708 has the an output signal of the form $Vout(x)=Vk \sin^n x$ for an input signal of the form $V in(x)=Vp \sin x$, which, through Fourier analysis, produces high frequency overtones. In the previous embodiments, exponent "n" has been one-half, wherein non-linear device 708 is identical to square root filter 10. In general, exponent "n" can be any positive value, wherein fractional values have the effect of exaggerating slopes as shown for n=½ in FIG. 4D, thereby producing a series of overtones as previously discussed. Exponent "n" can also be a positive integer. If n=2, for example, the trigonometric identity $\sin^2 x=(1-\cos 2x)/2$ shows that the squaring function comprises a second harmonic overtone. The specific purpose of non-linear device 708 in FIG. 7B as shown by FIG. 7C is to enhance the high frequency impact of the attack transient.

Figure 7D:
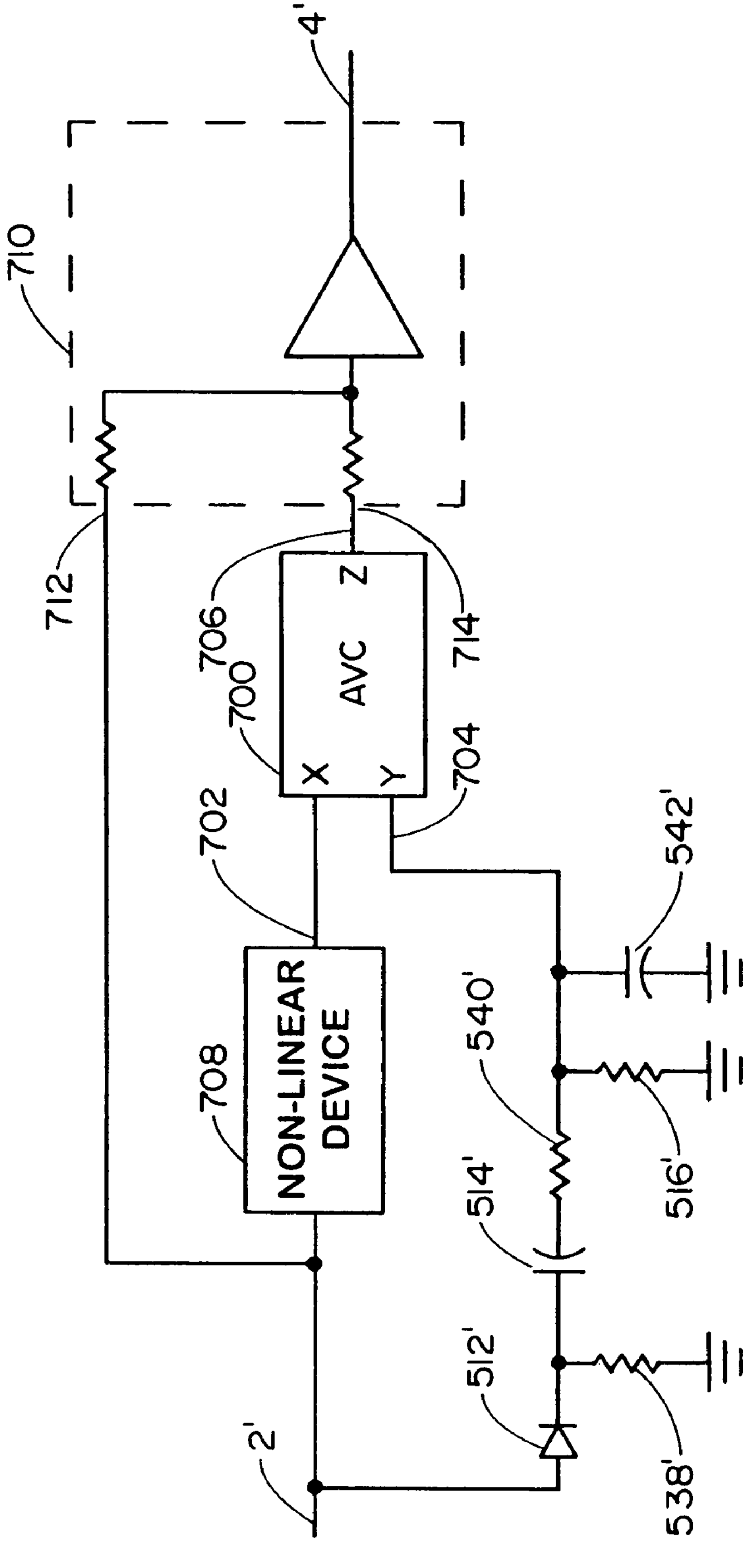

FIG. 7D is an alternative portion of the schematic in FIG. 7C in which a different arrangement of previously described blocks accomplish the objective of FIG. 7C. Input signal from terminal 2 is provided to non-linear device 708 which provides signal to x terminal 702 of AVC 700. The y terminal 704 of AVC 700 receives signal directly from resistor 542'. The z terminal 706 of AVC 700 provides signal to input 714 of summer 710, and input terminal 2' provides signal to input 712 of summer 710. Summer 710 provides signal to output terminal 4'. When the input signal is devoid of attack transients, the voltage across resistor 542' is approximately zero, AVC 700 provides no output signal, and signal at the output terminal 4' is the same as the input signal provided through input 712 of summer 710. When the input signal has an attack transient, the voltage across resistor 542 is non-zero and the gain of AVC 700 is non-zero, such that signal from non-linear device 708 is provided to input 714 of summer 710, to provide a momentary boost of signal to terminal 4' of sound enhancement system 100' during the attack transient. In this manner the artificial overtones produced from non-linear device 708 occurs in the signal at output terminal 4' but only for the duration of the momentary signal boost.

Figure 8A:
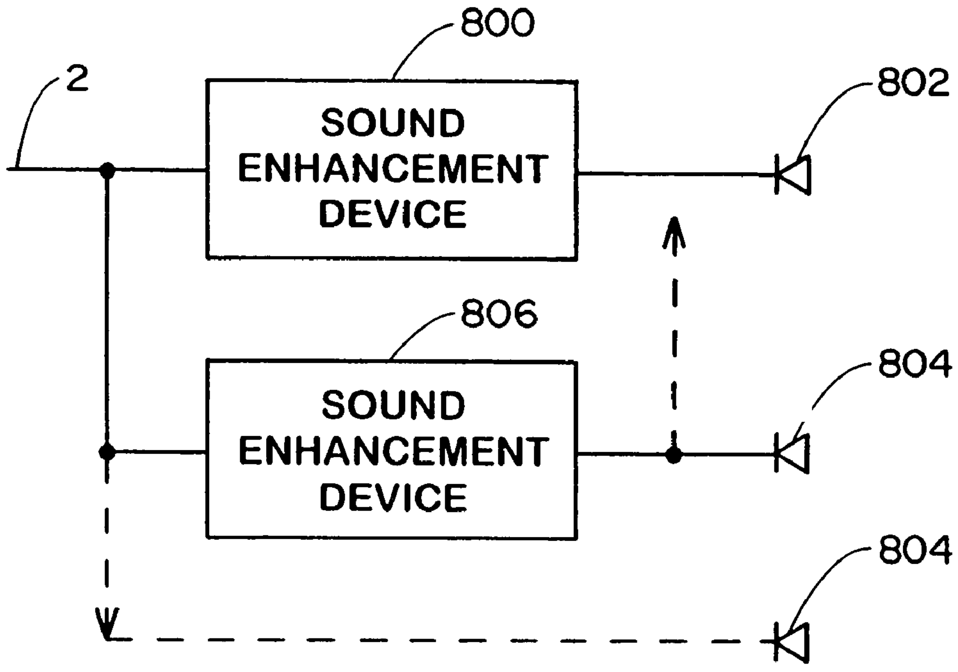
FIGS. 8A and 8B are block diagrams of the sound enhancement device included within monaural and multi-channel sound systems, respectively.
Figure 8B:
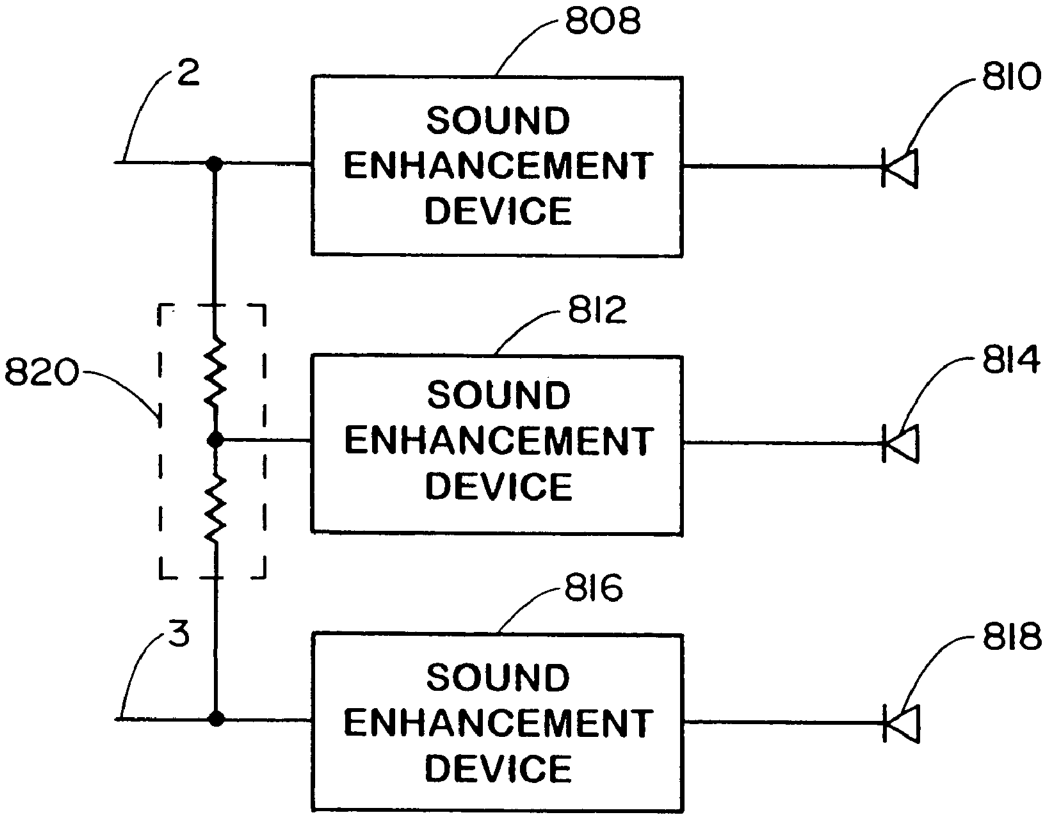

FIGS. 8A and 8B are examples of how the sound enhancement system 100 or 100', as has been previously described, may be incorporated as a sound enhancement device in various sound systems that receive one or more input signals and drive one or more recording channels or loudspeaker reproducers. FIG. 8A depicts a monaural signal source 2 in which a single sound enhancement device 800 drives a recording channel or loudspeaker 802, whereas loudspeaker 804 is directly connected to receive input signal, shown as a dotted line, creating a pseudo-stereo effect. A second sound enhancement device 806 may be inserted between the signal source 2 and loudspeaker 804 whose transient attack potentiometer 520 and overtone level potentiometer 304 (the brightness potentiometer in FIG. 6) are set differently than those of sound enhancement device 800 to emphasize different aspects of the input signal. The use of two sound enhancement devices 800 and 806 may make the stereo image more vivid since there are non-duplicated overtones and attack transients emanating from both loudspeakers 802 and 804. FIG. 8A also teaches how an input signal can be subdivided into a plurality of frequency ranges. The output of a plurality of sound enhancement devices 800 and 806, may have differing frequency ranges established by filters 6', overtone levels established by potentiometers 304, or transient attack levels established by potentiometers 520. The output signals from 800 and 806 may be combined and delivered to a single loudspeaker or recording channel shown as a dotted line to loudspeaker or recording channel 802. The input signal is split into predetermined ranges of frequency. The gains of 800 and 806 are independently adjustable, analogous to the controls on octave equalizers widely used in the industry.

FIG. 8B shows two input signals 2 and 3 of a multi-channel system in which sound enhancement devices 808 and 816 are inserted between loudspeakers or recording channels 810 and 818 respectively. Mixer 820 shows how two input channels may be blended, wherein sound enhancement device 812 inserted between the output of mixer 820 and loudspeaker 814 provides a center channel output effect. Likewise, mixer 820 can be a subtraction of the input signals 2 and 3. FIGS. 8A and 8B are examples among many of how a sound enhancement device or a plurality of sound enhancement devices may be configured to any number of advantages or needs.

The foregoing description has been presented using building blocks or electronic components. Many if not all of the illustrated embodiments can be implemented using digital techniques or software. Furthermore, the invention has been described in detail with particular embodiments, but it will be understood that variations and modifications within the spirit of the invention may occur to those skilled in the art to which the invention pertains.

What is claimed is:

1. A system for processing an information bearing signal, the system comprising:

an input device configured to receive the information bearing signal from a signal source;

a first control circuit coupled to an input port of the input device, the first control circuit being configured to generate a normalized information bearing signal in accordance with a predetermined first transfer function, the normalized information bearing signal being a function of a predetermined signal reference;

a transient detection circuit coupled to the first control circuit and the predetermined signal reference, the transient detection circuit being configured to detect transient signal components in the normalized information bearing signal and generate a detection response signal, the detection response signal being a function of the predetermined signal reference and transient impulse signals corresponding to detected transient signal components;

a second control circuit coupled to the first control circuit and the transient detection circuit, the second control circuit being configured to combine the normalized information bearing signal with the detection response signal in accordance with a second predetermined transfer function to thereby generate a conditioned signal, the conditioned signal including the information bearing signal with gain enhanced transient signal components; and an output device coupled to the second control circuit, the output device being configured to propagate the conditioned signal in accordance with a predetermined signal format.

2. The system of claim 1, wherein the first control circuit includes an input filter configured to remove low frequency signal content from the information bearing signal.

3. The system of claim 2, wherein the input filter is implemented with a high pass filter or a bandpass filter.

4. The system of claim 1, wherein the first control circuit further comprises an automatic volume control (AVC) circuit with negative feedback, the AVC circuit being configured to divide the information bearing signal by the negative feedback in accordance with the predetermined first transfer function.

5. The system of claim 4, wherein the first control circuit further comprises a harmonic generating filter configured to generate harmonic signal components from the information bearing signal.

6. The system of claim 1, wherein the second predetermined transfer function includes an inverse of the first predetermined transfer function.

7. The system of claim 1, wherein the detected transient signal components are characterized by an amplitude greater than an amplitude characterizing the predetermined signal reference.

8. The system of claim 1, wherein the detected transient signal components are characterized by a time duration greater than a predetermined time period.

9. The system of claim 1, wherein the transient detection circuit is configured to delay the transient response signal with respect to the detection of transient signal components by a predetermined period, the predetermined period not being greater than approximately two (2) milliseconds.

10. The system of claim 1, wherein the information bearing signal is an audio signal.

11. The system of claim 1, wherein the information bearing signal is configured to encode information by modulating at least one signal parameter.

12. The system of claim 11, wherein the at least one signal parameter is selected from a group of signal parameters that includes amplitude, frequency, and/or phase.

13. A system for processing an information bearing signal, the system comprising:

an input device configured to receive the information bearing signal from a signal source;

a first control circuit coupled to an input port of the input device, the first control circuit being configured to generate an amplitude information bearing signal in accordance with a predetermined first transfer function, a transient detection circuit coupled to the first control circuit and the predetermined signal reference, the transient detection circuit being configured to detect transient signal components in the amplitude bearing signal and generate a detection response signal, the detection response signal being a function of the transient impulse signals corresponding to detected transient signal components;

a second control circuit coupled to the first control circuit and the transient detection circuit, the second control circuit being configured to combine the information bearing signal with the detection response signal in accordance with a second predetermined transfer function to thereby generate a conditioned signal, the conditioned signal being the information bearing signal with gain enhanced transient signal components; and an output device coupled to the second control circuit, the output device being configured to propagate the conditioned signal in accordance with a predetermined signal format.

14. The system of claim 13, wherein the first control circuit includes an input filter configured to remove low frequency signal content from the information bearing signal.

15. The system of claim 14, wherein the input filter is implemented with a high pass filter or a bandpass filter.

16. The system of claim 13, wherein the first control circuit further comprises an automatic volume control (AVC) circuit with negative feedback, the AVC circuit being configured to divide the information bearing signal by the negative feedback in accordance with the predetermined first transfer function.

17. The system of claim 16, wherein the first control circuit further comprises a harmonic generating filter configured to generate harmonic signal components from the information bearing signal.

18. The system of claim 13, wherein the second predetermined transfer function includes an inverse of the first predetermined transfer function.

19. The system of claim 13, wherein the detected transient signal components are characterized by a time duration greater than a predetermined time period.

20. The system of claim 13, wherein the transient detection circuit is configured to delay the transient response signal with respect to the detection of transient signal components by a predetermined period, the predetermined period not being greater than approximately two (2) milliseconds.

* * * * *